United States Patent [19]

Liu et al.

[11] Patent Number: 4,521,887
[45] Date of Patent: Jun. 4, 1985

[54] W-SHAPED DIFFUSED STRIPE GAAS/ALGAAS LASER

[75] Inventors: Yet-Zen Liu, Westlake Village; Chi-Shain Hong, Newbury Park; P. Danial Dapkus, Anaheim, all of Calif.

[73] Assignee: The United States of America as represented by the Secretary of the Navy, Washington, D.C.

[21] Appl. No.: 415,639

[22] Filed: Sep. 7, 1982

[51] Int. Cl.³ .............................................. H01S 3/19
[52] U.S. Cl. ...................................... 372/45; 357/19; 372/46
[58] Field of Search ................ 372/44, 45, 46; 357/17

Primary Examiner—James W. Davie
Attorney, Agent, or Firm—Robert F. Beers; William T. Ellis; John L. Forrest

[57] ABSTRACT

A w-shaped diffused stripe GaAs/AlGaAs laser and a method for making the same. A double heterostructure layered structure includes a p-type GaAs active layer in contact with a p-type AlGaAs current blocking layer. These layers are sandwiched between two N-type AlGaAs confinement layers. A p-type zinc diffused stripe region having a w-shaped diffusion front extends longitudinally between two reflective surfaces located on respective ends of the device and extends vertically from the surface of the upper confinement layer through a portion of the lower confinement layer and through portions of the various intervening layers. In a method of forming the device, the various layers are formed by epitaxial growth or by metalorganic chemical vapor deposition. The stripe region is formed by diffusing zinc into the device from a source through a pair of parallel slots in a diffusion mask. The zinc diffused into the device is further driven-in by heating the device in the absence of the zinc source.

11 Claims, 4 Drawing Figures

W-SHAPED DIFFUSED STRIPE GAAS/ALGAAS LASER

BACKGROUND OF THE INVENTION

The present Invention relates, in general, to a novel low lasing threshold deep diffused stripe semiconductor laser and, more particularly, to a novel low lasing threshold deep w-shaped zinc-diffused narrow stripe AlGaAs/GaAs double-heterostructure laser.

Some of the characteristics of laser diodes that are important for fiber optic transmitter system applications include low cw laser threshold current, single mode operation, high differential quantum efficiency, small temperature dependence of laser threshold, and high output power. In addition, it is desirable that the growth of the structure and subsequent device processing be as simple as possible. Each of these desirable characteristics has been obtained separately in one or another of various laser structures which require specific control in growth or processing. However, no prior art device has combined all of these desirable characteristics in a single structure. The present Invention provides a novel solution to this problem.

In a stripe-geometry (Al,Ga)As double-heterostructure (DH) injection laser the electromagnetic field is guided along the active layer by spatial variations in both the gain and refractive index. In these devices the slightest asymmetry in the lateral dielectric constant profile can cause a shift in the lateral transverse mode toward to stripe edge where the gain is small or negative resulting in mode loss and producing undesirable non-linearities in the current verses light output curves. This problem can be partially avoided by reducing the stripe width to 10 $\mu$m or less. Unfortunately, other problems exist with such structures.

Introducing built-in refractive index profiles along the active layer provides refractive index guiding and thus tends to stabilize the lateral transverse modes. For example, the buried heterostructure (BH) laser achieves this by embedding a GaAs active region in (Al, Ga)As while simultaneously producing a device having a low lasing threshold. The transverse junction stripe (TJS) laser having an active region in a GaAs p-N junction sandwiched between (Al,Ga)As layers additionally provides a refractive index profile across the junction in the active layer due to differences in conductive type and impurity concentration.

In both the buried heterostructure and the transverse junction stripe devices, the available active regions are less than a few microns which results in low maximum output power and severe structural design limitations. Also, the transverse junction stripe device exhibits an undesirably high lasing threshold.

Another device which produces stabilized lateral transverse mode lasing is a planar stripe laser device with a deep zinc diffusion called a deep zinc diffusion stripe (DDS) laser as described by UENO and YONEZU, "Stable Transverse Mode Oscillations in Planar Stripe Laser With Deep Zn Diffusion", IEEE Journal of Quantum Electronics, VOL. QE 15, No. 10, October 1979. This device differs from other planar stripe devices primarily in the depth of the zinc diffusion front in relation to the active layer.

FIG. 1 illustrates a typical prior art deep diffusion stripe device in cross-section. The device includes an n-type GaAs active layer located between two n-type AlGaAs confinement layers on an n+GaAs substrate. Zinc is diffused into the device to form a "U" shaped diffusion front stripe region which reaches or passes through the GaAs active layer by a few tenths of microns. As a result of the stripe, the conduction type and carrier concentrations are different in the active stripe region than in the portions of the n-type active layer outside the stripe region thus producing a built-in refractive index step along the active layer. Lasing action takes place within the active stripe region with a relatively high lasing threshold.

The present Invention provides a novel laser diode device which is similar to the deep diffusion stripe device shown in FIG. 1 with the exception of two important differences: the use of a p-type active layer in place of the n-type active layer, and the use of a zinc diffused stripe region having a "w" shaped diffusion front. The present Invention provides a novel device having all of the desirable properties of the prior art deep diffusion stripe device and, in addition, exhibits a desirable low lasing threshold. Additionally, the position of the zinc stripe diffusion front is easier to control using the method of the present Invention thereby allowing much higher processing yields.

SUMMARY OF THE INVENTION

Accordingly, one object of the present Invention is to provide a novel low-lasing threshold semiconductor laser device.

Another object is to provide a novel stripe-geometry semiconductor laser device.

Still another object is to provide a novel semiconductor laser device which may be made by a novel process which achieves high processing yields.

These and other objectives are achieved by the present Invention which provides a novel stripe-geometry semiconductor laser device which includes a semiconductor substrate of a first conductivity type having first and second surfaces. A first semiconductor confinement layer of the first conductivity type is formed on the first surface of the substrate. An active semiconductor layer of a second conductivity type having a band gap narrower than that of the first confinement layer is formed on the first confinement layer forming a heterojunction therebetween followed by a current blocking layer of the second conductivity type which forms a heterojunction with the active layer. A second confinement layer of the first conductivity type is formed on the current blocking layer. The current blocking layer and the second confinement layer each have band gaps wider than that of the active layer. An elongated stripe region doped with an impurity of the second conductivity type extends longitudinally between two reflective surfaces located on respective ends of the device. Portions of the stripe region extend vertically from an upper surface of the second confinement layer through portions of the second confinement layer, the current blocking layer, the active layer, and through portions of the first confinement layer. The stripe region has a w-shaped cross-section taken in a vertical plane. A central portion of the stripe region extends vertically from the upper surface of the second confinement layer through portions of the current blocking layer. The stripe region defines two parallel longitudinally extending stripe active regions in the active layer with a portion of the active layer being located between the two longitudinally extending stripe regions. The active stripe regions have a higher index of refraction than the remaining portions of the active layer. Electrode means are coupled to the second surface of the substrate and to the upper surface of the second confinement layer. Laser oscillation takes place in the portion of the active layer located between the two longitudinally extending active stripe regions and the resultant laser radiation is guided by that portion of the active layer.

These and other objectives are achieved by a novel method of forming a stripe-geometry laser device which includes the steps of providing an n-type GaAs substrate, forming an n type $Al_xGa_{1-x}As$ first confinement layer on a major surface of the substrate, forming a p-type GaAs active layer on the first confinement layer, forming a p-type $Al_xGa_{1-x}As$ current blocking layer on the active layer, and forming an N-type $Al_xGa_{1-x}As$ second confinement layer on the current blocking layer. A diffusion mask is formed on a portion of the surface of the second confinement layer. The mask is etched to form two parallel elongated stripes therein. A p-type impurity is diffused through the two elongated stripes in the mask to form a p-type stripe region in the device which extends vertically from the surface of the second confinement layer through portions of the second confinement layer, the current blocking layer. the active layer, and portions of the first confinement layer. The stripe region has a w-shaped diffusion front. Finally, contact electrodes are formed on another surface of the substrate and on the surface of the second confinement layer.

BRIEF DESCRIPTION OF THE DRAWINGS

A more complete appreciation of the Invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
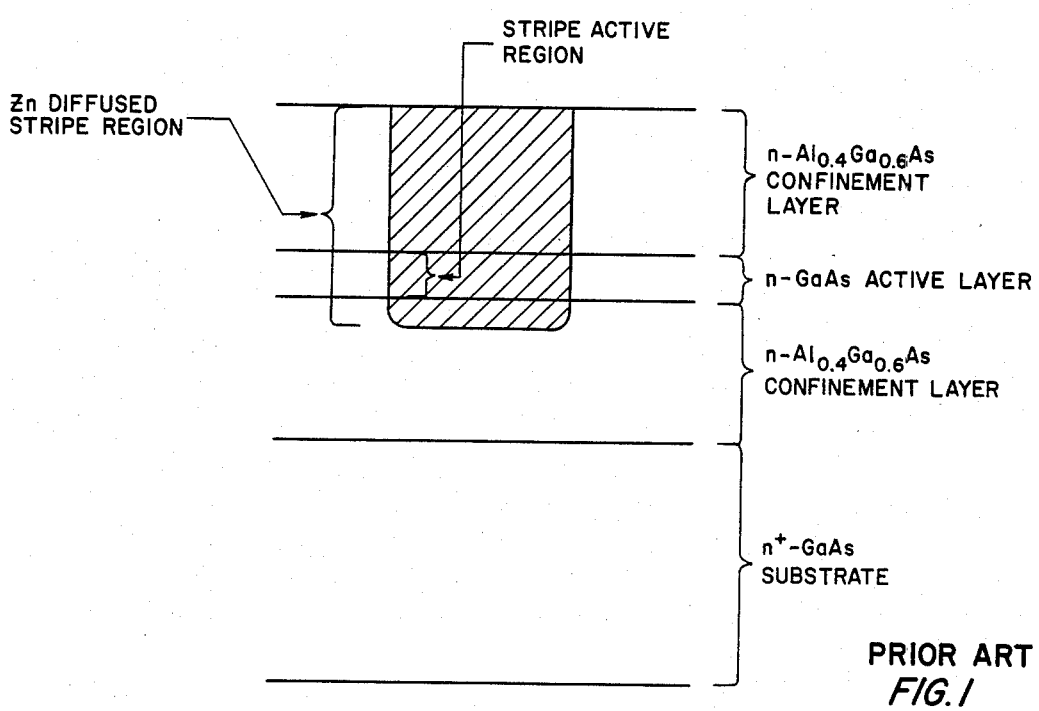
FIG. 1 illustrates, in cross-section. a prior art deep zinc diffusion stripe seminconductor laser.
Figure 2:
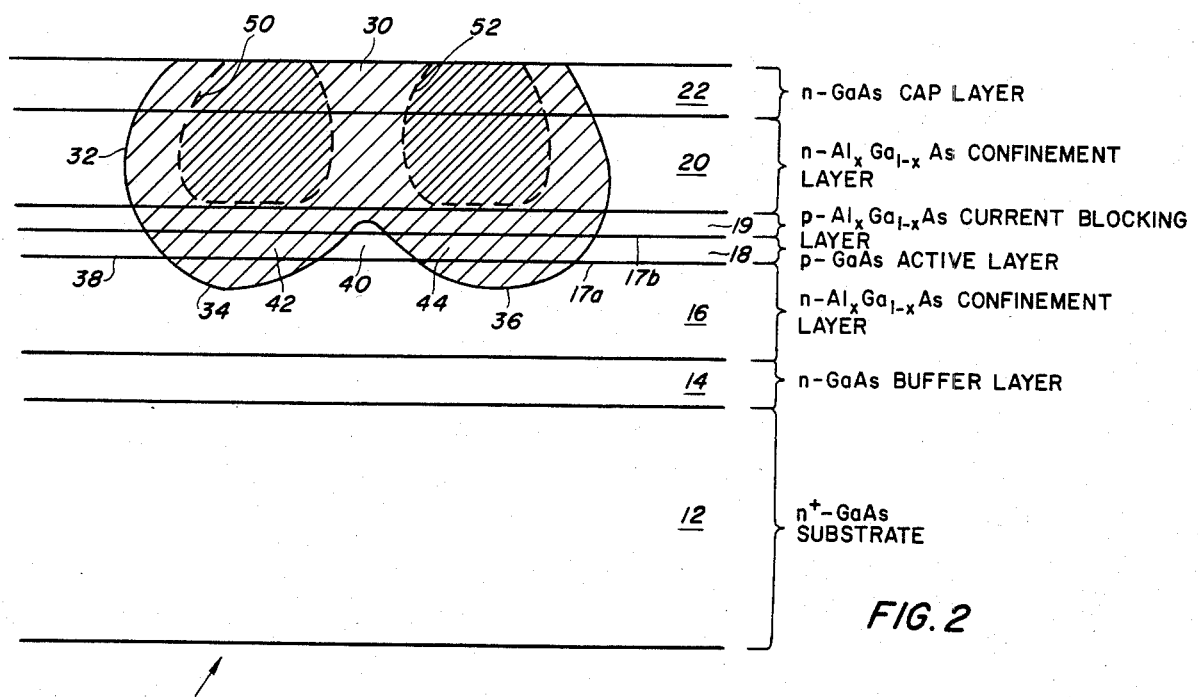
FIG. 2 illustrates, in cross-section, a preferred embodiment of a semiconductor laser device according to the present Invention.

Referring now to the drawings, wherein like reference numerals designate identical or corresponding parts throughout the several views, and more particularly to FIG. 2 thereof. a cross-section of a semiconductor laser device 10 according to a preferred embodiment of the present Invention is illustrated as including an n type GaAs buffer layer 14 formed on an n+ GaAs substrate 12. The buffer layer 14 provides a relatively defect-free clean surface upon which the remainder of the device is formed. As should be apparent to persons of skill in the art, the buffer layer 12 may be eliminated if the upper surface of the substrate 12 is sufficiently clean to support the growth of additional device layers.

The laser device 10 futher includes an n type $Al_xGa_{1-x}As$ lower confinement layer 16, a p-type GaAs active layer 18, a p-type $Al_xGa_{1-x}As$ current blocking layer 19, and an n-type $Al_xGa_{1-x}As$ upper confinement layer 20 all formed on the buffer layer 14 (or the substrate 12, if possible) as shown. The lower confinement layer 16 and the current blocking layer 19 form first and second heterojunctions 17a and 17b, respectively. with the active layer 18. The band gaps of the lower confinement layer 16, the current blocking layer 19, and the upper confinement layer 20 are each wider than the band gap of the active layer 18.

An n-type GaAs cap layer 22 covers the upper surface of the upper confinement layer 20 and is used for making contact to the various portions of the device 10 as is well-known in the art. The method of forming the various layers and the various doping levels of these layers will be discussed in detail below.

The current blocking layer 19 in combination with the active layer 18 allows separate optimization of the functions of each of these layers. In general in the absence of a current blocking layer a reduction in the thickness of the active layer results in a corresponding reduction in the lasing threshold down to a thickness which is too small for effective light confinement and for current blocking. Thus, the reduction of the active layer thickness to less than 0.1 um in the absence of a current blocking layer results in an effective increase in the lasing threshold. With the addition of the current blocking layer 19, the thickness of the active layer 18 may be reduced to optimize the lasing threshold.

Additionally, the current blocking layer 19 may supply an additional light guiding layer within the device if the aluminum content of the current blocking layer is less than that of the adjacent upper confinement layer 20. For example, if the upper confinement layer 20 is formed of $Al_xGa_{1-x}As$ and the current blocking layer is formed of $Al_xGa_{1-x}As$, light guiding will occur in the current blocking layer when $x>y$.

A zinc diffused stripe region 30 extends through the cap layer 22, the upper confinement layer 20, the current blocking layer 19, and the active region 18. The diffusion front 32 of the stripe region 30 has a "w" shape. The lower edges 34 and 36 of the diffusion front 32 may reach the upper surface 38 of the lower confinement layer or may actually be located within the lower confinement layer 16. Although not illustrated, it should be understood that the stripe region 30 longitudinally extends between two reflective surfaces located on respective ends of the device which provide feedback for the laser oscillation.

The n-p-n structure formed by the layers 16. 18, 19 and 20 outside the stripe region 30 automatically forms a reverse-biased junction. Lasing takes place at the portion 40 of the active layer 18 which is located between the two diffused portions 42 and 44 of the active layer. The stripe region 30 has a higher dielectric constant than that of the surrounding areas and thus provides a plurality of built-in refractive index steps along the active layer 18 and along the current blocking layer 19 at the various interfaces of these layers with the stripe region 30. The "w" shaped diffusion front 32 thus provides a lateral refractive-index profile for an optical waveguide.

The method of forming the laser device 10 of FIG. 2 will now be discussed. The layered structure was consecutively grown on a (100) oriented silicon-doped GaAs substrate 12 by metalorganic chemical vapor deposition at a temperature of 750° C. The following layers were sequentially grown: a 0.75 $\mu$m n-type selenium doped ($2\times10^{18}/cm^3$) GaAs buffer layer 14, a 2 $\mu$m n-type selenium doped ($5\times10^{17}/cm^3$) $Al_{0.4}Ga_{0.6}As$ lower confinement layer 16, a 0.07 $\mu$m zinc doped type ($1\times10^{18}$) p-type GaAs active layer 18, a 0.2 $\mu$m zinc dope ($1\times10^{18}$/cm$^3$) p-type Al$_{0.4}$Ga$_{0.6}$As current blocking layer 19, an approximately 2 μm n-type selenium doped ($1\times10^{17}$/cm$^3$) Al$_{0.4}$Ga$_{0.6}$As upper confinement layer 20, and a 0.1 μm n-type selenium doped ($2\times10^{18}$/cm$^3$) GaAs cap layer 22. Alternatively, the layered structure may be formed using liquid phase epitaxy at a temperature of 780° C. In this case, the n-type layers should be doped with tin and the p-type layers should be doped with germanium.

After the layered structure was formed, a plasma enhanced chemical vapor deposition Si$_3$N$_4$ film (not shown) was deposited on the cap layer 22 to serve as a diffusion mask. Next, a pair of 2 μm wide parallel stripes separated by a distance of 2 to 3 μm and aligned parallel to a cleaved edge were etched in the Si$_3$N$_4$ diffusion mask. Zinc was then diffused into the device 10 through the pair of stripes in the diffusion mask using a two-step diffusion process as follows.

The device was first sealed in a quartz ampul with a ZnAs$_2$ source. Diffusion was carried out at 650° C. for twenty minutes and quenched off to introduce zinc into the sample. At 650° C. the diffusion rates in n-type GaAs and n-type Al$_{0.4}$Ga$_{0.6}$As were determined to be 1.4 μm/hr$^{\frac{1}{2}}$ and 2.0 μm/hr$^{\frac{1}{2}}$, respectively. This first diffusion produced a very abrupt junction having a surface concentration of approximately $10^{20}$/cm$^3$. This layer of zinc then served as a source for a second drive-in diffusion step in the absence of the ZnAs$_2$ source. The second diffusion was carried out at 850° C. for two hours in an arsenic-rich atmosphere.

Upon examination of a sample, two types of diffusion fronts were observed indicating a "shoulder" in the diffusion profile resulting from the two-step process. Thus, the diffusion fronts 50 and 52 resulted from the first diffusion while the diffusion front 32 resulted from the second diffusion step. A self-limiting effect exists in driving the diffusion front from a AlGaAs layer to an adjacent GaAs layer due to the slower moving rate in GaAs and the finite diffusion source. The movement of the diffusion front thus deviates little from the square root of time dependence during the second drive-in diffusion. Thus, the final diffusion front 32 can be readily controlled to reach or slightly pass through the GaAs active layer 18 during the second diffusion.

After the diffusion was completed, the Si$_3$N$_4$ diffusion mask was completely removed. Ohmic contacts (not shown) of Au-Ge/Ni/Au (alloyed) and Cr/Au were formed on the upper and lower surfaces of the device 10, respectively, in a well-known manner and individual diodes were defined by cleaving. The finished devices were then bonded to a heat sink with indium solder for subsequent testing.

Figure 3:
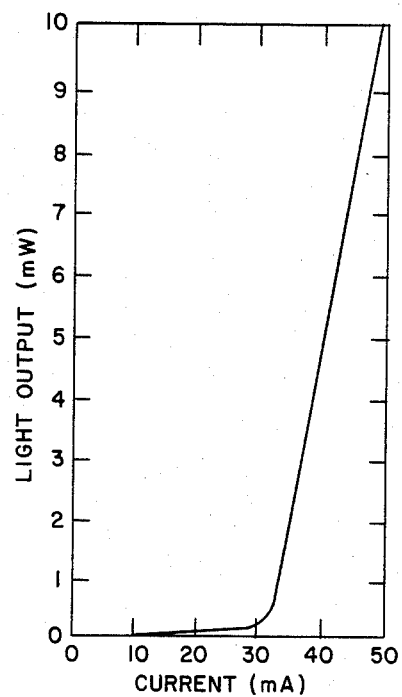
FIG. 3 illustrates the light output versus current curve for the device shown in FIG. 2.

FIG. 3 illustrates the output light power per facet versus input current for a 175 μm cavity length device as shown in FIG. 2 for pulsed operation. The indicated pulsed lasing threshold current $I_{th}$ is 30 mA. The observed cw threshold current (not shown) was observed to be approximately 10% higher than the pulsed threshold. As seen in FIG. 3, the output curve is very linear for currents above the threshold level.

Figure 4:
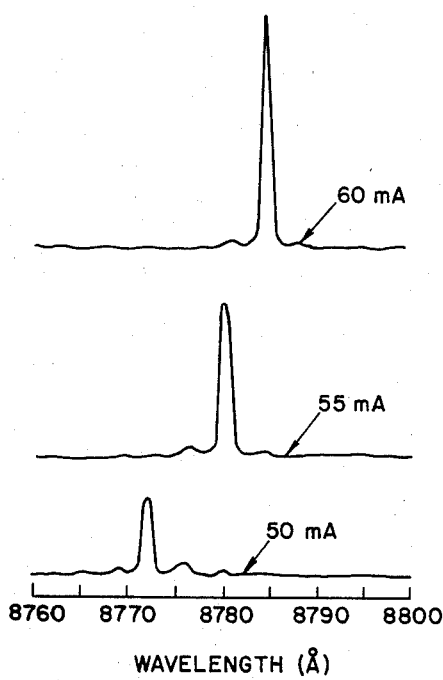
FIG. 4 illustrates the emission spectra at various current levels for the device shown in FIG. 2.

Representative emission spectra at various current levels are shown in FIG. 4 for pulsed operation. Single longitudinal mode laser operation was observed from $I \gtrsim 1.2\ I_{th}$ up to approximately twice the threshold current. The lasing wavelength was approximately 8780Å and shifted to longer wavelengths when the pumping current was increased.

An important feature of the laser device according to the present Invention is its extremely high quantum efficiency. The measured external differential quantum efficiency is about 80% as compared to 20–30% for normal double heterostructure lasers and 30–40% for buried heterostructure lasers.

Obviously, numerous (additional) modifications and variations of the present Invention are possible in light of the above teachings. It is therefore to be understood that within the scope of the appended claims, the Invention may be practiced otherwise than as specifically described herein.

What is claimed is:

1. A stripe-geometry semiconductor laser device comprising:
    a semiconductor substrate of a first conductivity type having first and second surfaces;
    a first semiconductor confinement layer formed on said first surface of said substrate, said first confinement layer being of said first conductivity type;
    an active semiconductor layer formed on said first confinement layer, said active layer being of a second conductivity type and having a band gap narrower than that of said first confinement layer, said active layer and said first confinement layer forming a heterojunction therebetween;
    a current blocking semiconductor layer of said second conductivity type formed on said active layer, said current blocking layer having a band gap wider than that of said active layer, said current blocking layer and said active layer forming a heterojunction therebetween;
    a second semiconductor confinement layer formed on said current blocking layer, said second confinement layer being of said first conductivity type and having a band gap wider than that of said active layer;
    an elongated stripe region extending longitudinally between two reflective surfaces located on respective ends of said device, portions of said stripe region extending vertically from an upper surface of said second confinement layer through portions of said current blocking layer, said active layer, and said first confinement layer, said stripe region having a w-shaped cross-section taken in a vertical plane, a central portion of said stripe region vertically extending from said upper surface of said second confinement layer through portions of said current block layer, said stripe region defining two parallel longitudinally extending stripe active regions in said active layer, a portion of said active layer being located between said two longitudinally extending active stripe regions, said stripe region being doped with an impurity of said second conductivity type, said active stripe regions having an index of refraction different from the remaining portions of said active layer; and
    electrode means coupled to said second surface of said substrate and to said upper surface of said second confinement layer;
    wherein laser oscillation takes place in said portion of said active layer located between said two longitudinally extending active stripe regions, the resultant laser radiation being guided by said portion of said active layer.

2. The stripe-geometry semiconductor laser device as recited in claim 1, which further comprises:

a buffer layer of said first conductivity type located between said substrate and said first confinement layer: and a cap layer of said first conductivity type located between said upper surface of said second confinement layer and said electrode means. said stripe region passing through a portion of said cap layer.

3. The stripe-geometry semiconductor laser device as recited in claim 1, wherein:

said first conductivity type is n-type: and
said second conductivity type is p-type.

4. The stripe-geometry semiconductor laser device as recited in claim 2, wherein:

said first conductivity type is n-type: and
said second conductivity type is p-type.

5. The stripe-geometry semiconductor laser device as recited in claims 1, 2, 3, or 4, wherein:

said substrate comprises GaAs;
said first confinement layer comprises $Al_xGa_{1-x}As$, where $0<x<1$:
said active layer comprises GaAs;
said current blocking layer comprises $Al_xGa_{1-x}As$, where $0<x<1$; and
said second confinement layer comprises $Al_xGa_{1-x}As$, where $0<x<1$.

6. The stripe-geometry semiconductor laser device as recited in claim 5, wherein:

said quantity x is equal to 0.4 and said quantity $(1-x)$ is equal to 0.6.

7. The stripe-geometry semiconductor laser device as recited n claims 1, 2, 3, or 4, wherein:

said stripe region is doped with zinc.

8. The stripe-geometry semiconductor laser device as recited in claim 5, wherein:

said stripe region is doped with zinc.

9. The stripe-geometry semiconductor laser device as recited in claims 2 or 4, wherein:

said substrate comprises GaAs;
said buffer layer comprises GaAs;
said first confinement layer comprises $Al_xGa_{1-x}As$, wherein $0<x<1$;
said active layer comprises GaAs:
said current blocking layer comprises $Al_xGa_{1-x}As$, where $0<x'1$;
said second confinement layer comprises $Al_xGa_{1-x}As$, where $0<x<1$; and
said cap layer comprises GaAs.

10. The stripe-geometry laser device as recited in claim 9, wherein:

said quantity x is equal to 0.4 and said quantity $(1-x)$ is equal to 0.6.

11. The stripe-geometry laser device as recited in claim 9, wherein:

said stripe region is doped with zinc.

* * * * *